United States Patent [19]
King et al.

[11] Patent Number: 5,798,192
[45] Date of Patent: Aug. 25, 1998

[54] STRUCTURE OF A MASK FOR USE IN A LITHOGRAPHY PROCESS OF A SEMICONDUCTOR FABRICATION

[75] Inventors: Ming-Chu King, Taichung; Shih-Shiung Chen, Chiayi; Ying-Chen Chao, Hsinchu, all of Taiwan

[73] Assignee: Taiwan Semiconductor Manufacturing Co., Ltd., Hsinchu, Taiwan

[21] Appl. No.: 834,330

[22] Filed: Apr. 15, 1997

[51] Int. Cl.$^6$ ........................................... G03F 9/00
[52] U.S. Cl. ........................................... 430/5
[58] Field of Search ........................ 430/5, 322, 323

[56] References Cited

U.S. PATENT DOCUMENTS 4,587,184   5/1986   Schneider-gmelch et al. ......... 430/5
5,403,683   4/1995   Ohta et al. .............................. 430/5

*Primary Examiner*—S. Rosasco
*Attorney, Agent, or Firm*—Christensen, O'Connor, Johnson & Kindness PLLC

[57] ABSTRACT

A structure of a mask for use in a lithography process in a semiconductor fabrication procedure is disclosed. The structure comprising: a mask base being made of transparent material; a plurality of patterns formed on said mask base, said patterns being used for generating an image on a wafer and being made of a conductive opaque material; and a conductive layer formed on said mask base and said plurality of patterns.

8 Claims, 2 Drawing Sheets

STRUCTURE OF A MASK FOR USE IN A LITHOGRAPHY PROCESS OF A SEMICONDUCTOR FABRICATION

FIELD OF THE INVENTION

The present invention relates to a mask used in the manufacture of integrated circuits, and more specifically, to a structure of a mask for reducing electrostatic discharge induced chrome damage.

BACKGROUND OF THE INVENTION

Integrated circuit fabrication requires that precisely controlled quantities of dopants be implanted into tiny regions of a layer or a substrate. Moreover, most of the layers need to be etched during the fabrication. Subsequently, these regions are interconnected to form some desired functions. Typically, the masks that define such regions are generated by lithographic process. In general, photoresists are used to serve as the mask. A layer of photo sensitive material is coated on an underlying layer or on the substrate. Then, the photoresist layer is selectively exposed by a form of radiation. The pattern in the photoresist is generated when the substrate undergoes the step of development. The residual photoresist is left on the underlying layer to prevent a portion of the underlying layer from etching or to serve as a mask for implant.

A mask is defined as a pattern tool which contains patterns that can be transferred to an entire wafer in one exposure. Such a mask can be patterned by step-and-repeating the individual patterns from a reticle with a high-speed step-and repeat camera. Defects in masks and reticles have always been a source of yield reduction in integrated circuit manufacture.

Making masks for optical printing starts with square glass plates. The plates are first coated with a material opaque in the wavelength region used to expose the photoresist. Typically, chromium is most commonly used. The coating process is very critical, since if any pin holes exist in the metal, they will remain as part of the finished mask. The metal is then coated with resist, and the resist is exposed to the appropriate image. An optical generator builds up the image by exposing a short line segment, moving a small distance, exposing another short segment, and continuing until the whole mask pattern has been exposed.

However, one common type of mask defect is "chrome damage" that causes the failure to transfer accurate patterns. That is, the corners of the chrome pattern are damaged due to electrostatic discharge (ESD). The electrostatic discharge is generated activities in the ambient environment.

SUMMARY OF THE INVENTION

A structure of a mask for use in a lithography process in a semiconductor fabrication procedure is disclosed. The structure comprising: a mask base being made of transparent material; a plurality of patterns formed on said mask base, said patterns being used for generating an image on a wafer and being made of a conductive opaque material; and a conductive layer formed on said mask base and said plurality of patterns.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
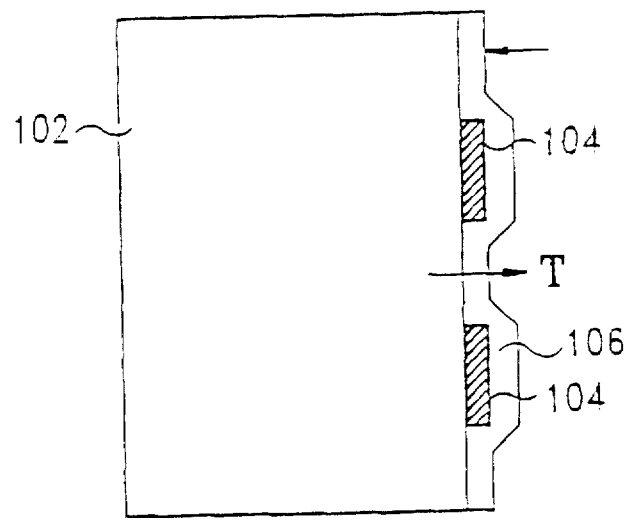
FIG. 1 is a cross section view of a mask in accordance with the present invention.

Referring to FIG. 1, a mask structure 100 is disclosed to prevent the mask from damage by electrostatic discharge (ESD) damage. The present invention includes a plate that is made of a transparent material to serve as a mask base 102. Preferably, the mask base 102 can be made of glass or quartz. In general, the thickness of the mask base is in the range of between 6.2 mm to 6.5 mm The mask base 102 is coated with patterns 104. The patterns 104 are used to transfer an image to a photoresist for making an etching or implanting mask. The patterns 104 are typically made of conductive and opaque material. Typically, chromium is used to form the patterns 104. The thickness of the chromium patterns 104 is about 800 to 1200 angstroms.

Still referring to FIG. 1, in accordance with the present invention, a thin conductive layer 106 is formed on the chrome patterns 104 and the mask base 102 to prevent the chrome patterns 104 from the electrostatic discharge induced damage. In the preferred embodiment, the conductive layer 106 is a silver layer of about 10 to 50 angstroms thickness. The conductive layer 106 is thin enough so that the developing radiation will transmit through the conductive layer 106 with very small attenuation, on the order of 3%.

In the prior art, without the conductive layer 106, electrons would accumulate at the corners of the chrome patterns 104. Further, in the prior art structure, patterns 104 are often times "island" structures on the mask base. Therefore, the electrons cannot conduct to other pattern regions. The electron field at the corners will be far higher than the plate region, and that will cause ESD induced chrome damage.

In the present invention, a thin conductive layer (preferably silver) 106 is formed on the pattern 104, the electrons will be able to move on the surface of the silver layer 106 and will not be confined at the corners of the patterns 104. Thus, the electrons distribute more uniformly on the mask 100 and the electron field at the corners of the patterns 104 is reduced by the present invention.

Figure 2:
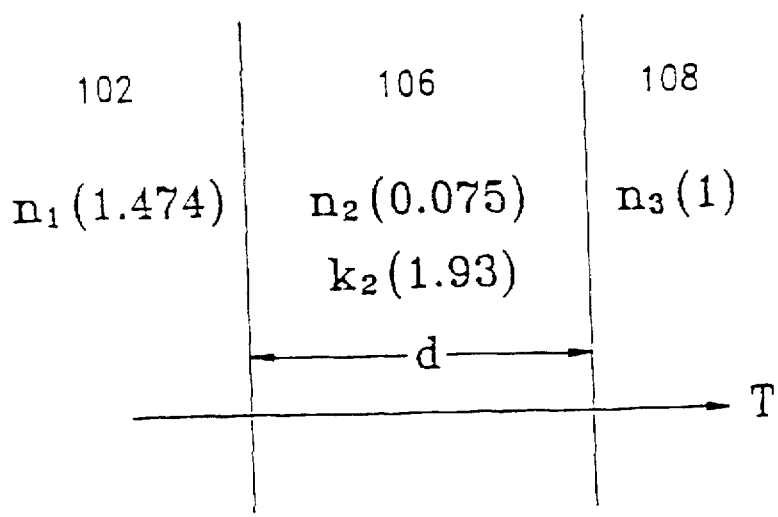
FIG. 2 is a cross section view of a mask illustrating the transmittance through the silver layer in accordance with the present invention.

Turning to FIG. 2, a schematic diagram illustrating the transmittance of the light from the mask base (quartz) 102 through the thin silver layer 106 is shown. In the drawing, the complex refractive index is typically denoted by $N=n-iκ$, where $n$ is the index of refraction, $κ$ is the extinction index. The $n_1$ of the quartz 102 is about 1.474, the $n_2$ of the silver layer 106 is about 0.075, and the $n_3$ of the air 108 is about 1. Further, the $κ_2$ of the silver 106 is about 1.93. The thickness of the silver layer 106 is denoted by $d$. Moreover, $T$ refers to the direction of the transmittance of the developing light from the light source as it passes through the quartz 102 and silver layer 106.

Figure 3:
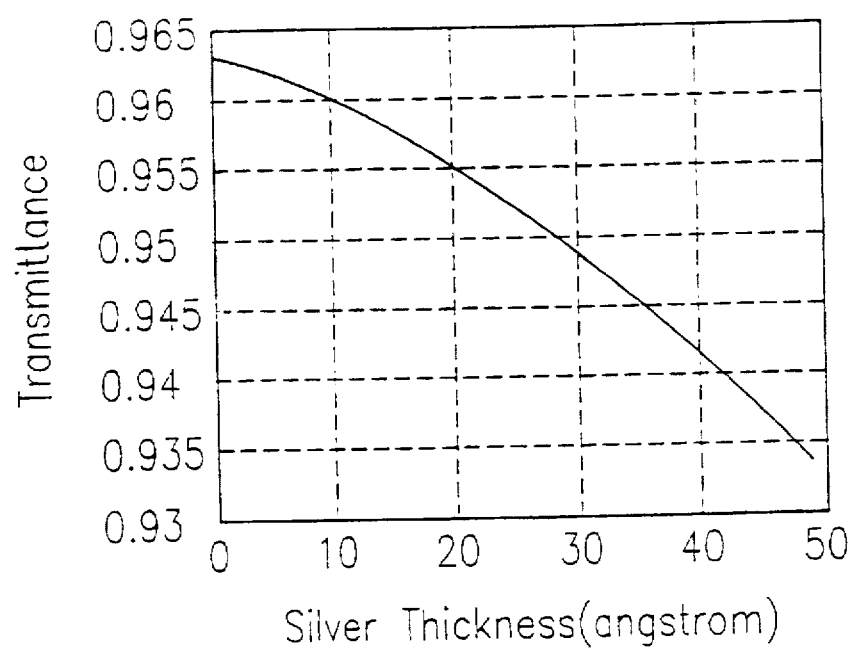
FIG. 3 is a schematics illustrating the relationship between the transmittance and the silver thickness in accordance with the present invention.

The formula used to calculate the transmittance is denoted by:

$$T = n_3/n_1 |t|^2$$

where $t = t_{12} t_{23} e^{-j\phi} / 1 - r_{21} r_{23}\ e^{-2j\phi}$, $k_1 = 2\pi n_1/\lambda$, $k_2 = 2\pi(n_2 - j\kappa_2)/\lambda$, $k_3 = 2\pi n_3/\lambda$, $t_{12} = 2k_1/(k_1+k_2)$, $t_{23} = 2k_2/(k_2 +$ $k_3$), $r_{21}=(k_2-k_1)/(k_1+k_2)$, $r_{23}=(k_2-k_3)/(k_2+k_3)$, $\phi=k_2d$, and $\lambda$ denotes the wavelength of the light The transmittance of the light from the quartz through the silver layer 106 with varying of the silver thickness as calculate from the equations above is shown in FIG. 3. If the thickness (d) of the silver layer 106 is zero, the T is 0.9633. If the (d) of the silver layer 104 is about 30 angstroms, the T is about 0.9487. The transmittance is only reduced about ((0.9633−0.9487)/0.9633) or 1.52%. Thus, the thin silver is substantially transparent to the incident light.

As is understood by a person skilled in the art, the foregoing preferred embodiment of the present invention is illustrative of the present invention rather than limiting of the present invention. For example, quartz or glass can be used to act as the mask base. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A structure of a mask for use in a lithography process in a semiconductor fabrication procedure, said structure comprising:
   a mask base being made of transparent material selected from a group consisting of glass and quartz;
   at least one pattern formed on said mask base, said at least one pattern being used for generating an image on a wafer and being made of a conductive opaque material; and
   a silver layer formed on said mask base and said at least one pattern for moving electrons that are confined at the corners of said at least one pattern on a surface of said silver layer, thereby distributing said electrons uniformly on said mask.

2. The structure of claim 1, wherein said patterns comprise metal.

3. The structure of claim 2, wherein said patterns comprise chrome.

4. The structure of claim 1, wherein the thickness of said silver layer is about 10 to 50 angstroms.

5. The structure of claim 1, wherein the refractive index of said quartz is about 1.47.

6. The structure of claim 1, wherein the refractive index of said silver is n=0.075 and κ=1.93.

7. The structure of claim 6, wherein the thickness of said conductive layer is about 10 to 50 angstroms.

8. A method of forming a mask for use in developing a pattern on a photoresist, the method comprising the steps of:

forming onto a mask base an opaque material so as to form said pattern; and forming over said mask base and said opaque material a silver layer for moving electrons generated in an exposing procedure on a surface of said silver layer thereby distributing said electrons uniformly on said mask.

* * * * *